United States Patent
Terada

(10) Patent No.: US 7,312,971 B2
(45) Date of Patent: Dec. 25, 2007

(54) SURGE ABSORPTION CIRCUIT AND LAMINATED SURGE ABSORPTION DEVICE

(75) Inventor: Yuji Terada, Tokyo (JP)

(73) Assignee: TDK Corporation, Tokyo (JP)

( * ) Notice: Subject to any disclaimer, the term of this patent is extended or adjusted under 35 U.S.C. 154(b) by 237 days.

(21) Appl. No.: 11/296,374

(22) Filed: Dec. 8, 2005

(65) Prior Publication Data

US 2006/0126239 A1 Jun. 15, 2006

(30) Foreign Application Priority Data

Dec. 15, 2004 (JP) ............ P2004-363693

(51) Int. Cl.
*H01C 7/12* (2006.01)
(52) U.S. Cl. ...................... 361/127; 361/119
(58) Field of Classification Search ............. 361/117, 361/118, 119, 127
See application file for complete search history.

(56) References Cited

U.S. PATENT DOCUMENTS 5,532,897 A 7/1996 Carpenter, Jr.
6,385,030 B1 * 5/2002 Beene ................... 361/119
6,788,169 B1 * 9/2004 Schemmann et al. ....... 333/177

FOREIGN PATENT DOCUMENTS

| JP | A-63-302726 | 12/1988 |
| JP | A 2001-60838 | 3/2001 |
| KR | A-10-2001-0039466 | 5/2001 |
| KR | B1-10-2004-0089550 | 10/2004 |

* cited by examiner

*Primary Examiner*—Michael Sherry
*Assistant Examiner*—Danny Nguyen
(74) *Attorney, Agent, or Firm*—Oliff & Berridge PLC

(57) ABSTRACT

A surge absorption circuit of one embodiment comprises an input terminal; an output terminal; a common terminal; a first surge absorption element and a second surge absorption element which are connected in series between the input terminal and the output terminal; a first inductive element provided in parallel to the first surge absorption element and the second surge absorption element, and connected to the input terminal and the output terminal; a second inductive element connected to a connection point of the first surge absorption element and the second surge absorption element and connected to the common terminal.

6 Claims, 14 Drawing Sheets

SURGE ABSORPTION CIRCUIT AND LAMINATED SURGE ABSORPTION DEVICE

BACKGROUND OF THE INVENTION

1. Field of the Invention

The present invention relates to a surge absorption circuit with improved high frequency characteristics and a laminated surge absorption device.

2. Related Background of the Invention

Semiconductor devices such as IC and LSI are destroyed or degraded in characteristics by high voltage static electricity. As a countermeasure against the static electricity for the semiconductor device, a surge absorption element such as a varistor is used. The surge absorption element typically represented by a varistor has a stray capacitive component and a stray inductive component, therefore, if applied to a circuit dealing with a high speed signal, it degrades the signal.

FIG. 1 is a diagram showing a conventional surge absorption circuit to which a varistor is applied. A surge absorption circuit 100 shown in FIG. 1 has an input/output terminal 101, a common terminal 102 and a varistor 103. When an input signal with a small amplitude is input to the input/output terminal 101, the varistor 103 remains highly resistive and does not give influence on the input signal. On the other hand, when a high voltage surge enters the input/output terminal 101, the high voltage surge is forced to pass through the varistor 103 to the common terminal 102. As a result, if the surge absorption circuit 100 shown in FIG. 1 is connected to the input/output terminal of a semiconductor device, the semiconductor device is protected from a high voltage surge.

FIG. 2 is a diagram showing an equivalent circuit of a varistor. As shown in FIG. 2, a varistor can be expressed equivalently by a variable resistor 104 and a stray capacitance 105, provided in parallel between one terminal and the other terminal. The resistance value of the variable resistor 104 is large in general, and becomes small when a high voltage surge is applied, therefore, it is possible for a varistor to protect a semiconductor device from a high voltage surge. However, since there exists the stray capacitance 105, a varistor attached to the input/output side of a semiconductor device dealing with a high speed signal may be a cause of degradation of the high speed signal.

FIG. 3 is a diagram showing the calculation result of S parameters S11 and S21 of the surge absorption circuit expressed by the equivalent circuit shown in FIG. 2. FIG. 3 shows the S parameters S11 and S21 when the capacitance Cz of the stray capacitance is 1 pF, 3 pF, and 5 pF, respectively. When the stray capacitance is 5 pF, S21 begins to degrade when the frequency of a signal exceeds 100 MHz and it is no longer possible to transmit the signal. In addition, S11 also becomes large and the reflection characteristic degrades. Even when the stray capacitance is 1 pF, the same result occurs when the frequency of the signal exceeds 1 GHz. Since the stray capacitance has a tradeoff relationship to a clamping voltage and a surge durability, there has been a problem that a surge absorption element having excellent characteristic cannot be applied to the use of a high speed signal.

FIG. 4 is a diagram showing the TDR (Time Domain Reflectmetry) test result of a conventional surge absorption circuit. FIG. 4 shows TDR when the capacitance Cz of the stray capacitance is 1 pF, 3 pF, and 5 pF, respectively. An input impedance Zi for a pulse signal whose rise time and fall time are 200 ps and signal amplitude is 1 $V_{0-p}$ degrades to about 40 Ω when the stray capacitance is 5 pF while it is 100 Ω in the steady state. Even when the stray capacitance is 1 pF, the input impedance degrades to 80 Ω.

As described above, when a surge absorption circuit is applied to a circuit dealing with a high speed signal, it is necessary to reduce the stray capacitive component to avoid degradation in the rise characteristic and delay characteristic of a high speed signal. On the other hand, if the stray capacitive component of a surge absorption element is reduced, the clamping voltage of the surge absorption element is raised and the surge durability is reduced.

A surge absorption circuit that reduces the influence of the stray capacitive component has already been proposed. For example, by combining an inductive element and a surge absorption element, it is possible to attain impedance matching of the surge absorption circuit. FIG. 5 is a diagram showing an example of a conventional surge absorption circuit in which two varistors are combined with an inductive element. In a surge absorption circuit 110 shown in FIG. 5, a varistor 115 is connected between an input terminal 111 and a common terminal 113. A varistor 116 is connected between an output terminal 112 and a common terminal 113. A inductive element is connected between the input terminal 111 and the output terminal 112.

FIG. 6 is a diagram showing an example of a conventional surge absorption circuit in which an inductive element is combined with two varistors. In a surge absorption circuit 120 shown in FIG. 6, a parallel circuit having a varistor 124 and an inductive element 125 is connected to a varistor 123 in series between an input/output terminal 121 and a common terminal 122. Such a surge absorption circuit is disclosed in, for example, Japanese Patent Application Laid-open No. 2001-60838.

SUMMARY OF THE INVENTION

However, even the circuit shown in FIG. 5 cannot realize sufficient characteristics. An input impedance Zin of the circuit shown in FIG. 5 is expressed by the following equation (1). The varistors 115 and 116 are expressed by the equivalent circuit shown in FIG. 2, respectively. However, it is approximated only by the stray capacitance 105 in FIG. 2 for a high speed signal with small amplitude.

$$Zin = \sqrt{\frac{Lz}{Cz} \frac{1}{1 - \omega^2 LzCz/4}} \quad (1)$$

The input impedance Zin in the equation (1) becomes a value shown in the following equation (3) when the following expression (2-1) and the following expression (2-2) are satisfied. $Z_0$ is a characteristic impedance of a signal line into which a surge absorption circuit is inserted.

$$1 \gg \omega^2 LzCz/4 \quad (2\text{-}1)$$

$$Z_0 \gg \omega Lz/2 \quad (2\text{-}2)$$

$$Zin = \sqrt{\frac{Lz}{Cz}} \quad (3)$$

Therefore, if an inductive element of which inductance Lz is equal to be a value shown in the following equation (4) is used, it is possible to match the input impedance to the characteristic impedance of the signal line.

$$Lz=Z_0^2 Cz \quad (4)$$

However, because of the conditions of the expression (2-1) and expression (2-2), it is not possible to match the input impedance to the characteristic impedance at high frequencies. Therefore, the situation remains unchanged and it is still necessary to reduce the stray capacitance of the varistor.

Frequency characteristics of a surge absorption circuit, which is a passive circuit, are sufficient to evaluate its input impedance. Hereinafter, the frequency characteristics of a surge absorption circuit are evaluated by an input impedance.

Even in a circuit shown in FIG. 6, it is difficult to realize impedance matching over a wide frequency band because the stray capacitance of the varistor 123 and the inductive element 125 constitute a band pass filter. Therefore, it is not possible to realize sufficient characteristics for a high speed signal.

An object of the present invention is to provide a surge absorption circuit excellent in impedance matching even for a high speed signal, and to provide a laminated surge absorption device capable of utilizing for the surge absorption circuit.

A first surge absorption circuit of the present invention cancels the influence of the stray capacitive component of a surge absorption element by utilizing an inductive element.

Specifically, the first surge absorption circuit of the present invention comprises (a) an input terminal; (b) an output terminal; (c) a common terminal; (d) a first surge absorption element and a second surge absorption element which are connected in series between the input terminal and the output terminal; (e) a first inductive element provided in parallel to the first surge absorption element and the second surge absorption element, and connected to the input terminal and the output terminal; (f) a second inductive element connected to a connection point of the first surge absorption element and the second surge absorption element and connected to the common terminal. The input terminal, the output terminal, and the common terminal are provided for connection with the external.

In the first surge absorption circuit, the first inductive element connected between the input terminal and the output terminal with respect to the first surge absorption element and the second surge absorption circuit which are connected in series between the input terminal and the output terminal. The second inductive element is connected between the two surge absorption elements and the common terminal. According to the first surge absorption circuit, it is possible to set values of the first and second inductive elements appropriately to the stray capacitive components of the surge absorption elements. Therefore, the first surge absorption circuit can realize an input impedance with flat frequency characteristics over a wide frequency band by canceling the influence of the stray capacitive components.

Accordingly, the first surge absorption circuit is capable of protecting a semiconductor device and the like from high voltage static electricity and is excellent in impedance matching even for a high speed signal.

A second surge absorption circuit of the present invention cancels the influence of the stray capacitive components of the surge absorption element by further comprising a capacitive element, in addition to the configuration of the first surge absorption circuit.

Specifically, the second surge absorption circuit further comprises the capacitive element provided between the input terminal and the output terminal.

In the second surge absorption circuit, the first inductive element and the capacitive element is connected between the input terminal and the output terminal, with respect to the first and second surge absorption element connected in series between the input terminal and the output terminal. The second inductive element is connected between the two surge absorption elements and the common terminal. According to the second surge absorption circuit, it is possible to set a value of the capacitive element, and values of the first and second inductive elements, with respect to the stray capacitive components of the surge absorption elements. Therefore, the second surge absorption element can realize an input impedance with flat frequency characteristics over a wide frequency band by canceling the influence of the stray capacitive components.

In addition, when the first inductive element has a stray capacitive component, by adding another capacitive element in parallel to the stray capacitive component and thereby canceling the capacitance added thereto and the stray capacitive components of the two surge absorption elements, it is possible to realize an input impedance with flat frequency characteristics over a wide frequency band.

In another aspect, in the second surge absorption circuit, the capacitive element can be considered as the stray capacitive component of the first inductive element. That is, the second surge absorption circuit can be considered as a surge absorption circuit which realize an input impedance with flat frequency characteristics over a wide frequency band by canceling the influence of the stray capacitive component provided in parallel to the first inductive element and the stray capacitive components of the two surge absorption element by the first and second inductive element without providing the capacitive element.

Therefore, the second surge absorption circuit is capable of protecting a semiconductor device and the like from high voltage static electricity and is excellent in impedance matching even for a high speed signal.

A laminated surge absorption device of the present invention configures the first or second surge absorption circuit. The laminated surge absorption device is configured as a laminated body which includes conductive patterns in interior portion and on a surface thereof This laminated surge absorption device is compact and can reduce the stray capacitive components.

A laminated surge absorption device of one embodiment according to the present invention can be used as the first surge absorption circuit. This laminated surge absorption device comprises (a) a plurality of insulating layers laminated each other; (b) a pair of first surge absorption element patterns including a conductor and facing with each other via any one of the insulating layers; (c) a pair of second surge absorption element patterns including a conductor and facing with each other via any one of the insulating layers; (d) a first inductive element pattern including a conductor and provided on any one of the insulating layers; (e) a second inductive element pattern including a conductor and provided on any one of the insulating layers; (f) an input electrode provided on a surface define by the insulating layers (g) an output electrode provided on the surface; and (g) a common electrode provided on the surface. One of the pair of the first surge absorption element patterns is connected to the input electrode. One of the pair of the second surge absorption element patterns is connected to the output electrode. The other of the pair of the first surge absorption element patterns and the other of the pair of the second surge absorption element patterns are connected to each other. One end of the first inductive element pattern is connected to the input electrode. The other end of the first inductive element pattern is connected to the output electrode. One end of the second inductive element pattern is connected to the other of the pair of first surge absorption element patterns and the other of the pair of the second surge absorption element patterns. The other end of the second inductive element pattern is connected to the common electrode.

A second laminated surge absorption device of one embodiment according to the present invention can be used as the second surge absorption circuit. The second laminated surge absorption device further comprises a pair of capacitive element patterns, in addition to the configuration of the first surge absorption device. The pair of capacitive element patterns includes a conductor and face with each other via any one of the insulating layers. One of the pair of capacitive element patterns is connected to the input electrode. The other of the pair of capacitive element patterns is connected to the output electrode.

DESCRIPTION OF THE PREFERRED EMBODIMENTS

Embodiments of the present invention are explained below with reference to accompanying drawings. The following embodiments to be explained below are only configuration examples of the present invention and the present invention is not limited to the following embodiments.

In the following embodiments, as a representative example of the surge absorption element, a varistor is employed. However, as a matter of course, even if the varistor is replaced with another surge absorption element, the same operation and effect can be expected.

First Embodiment

Figure 7:
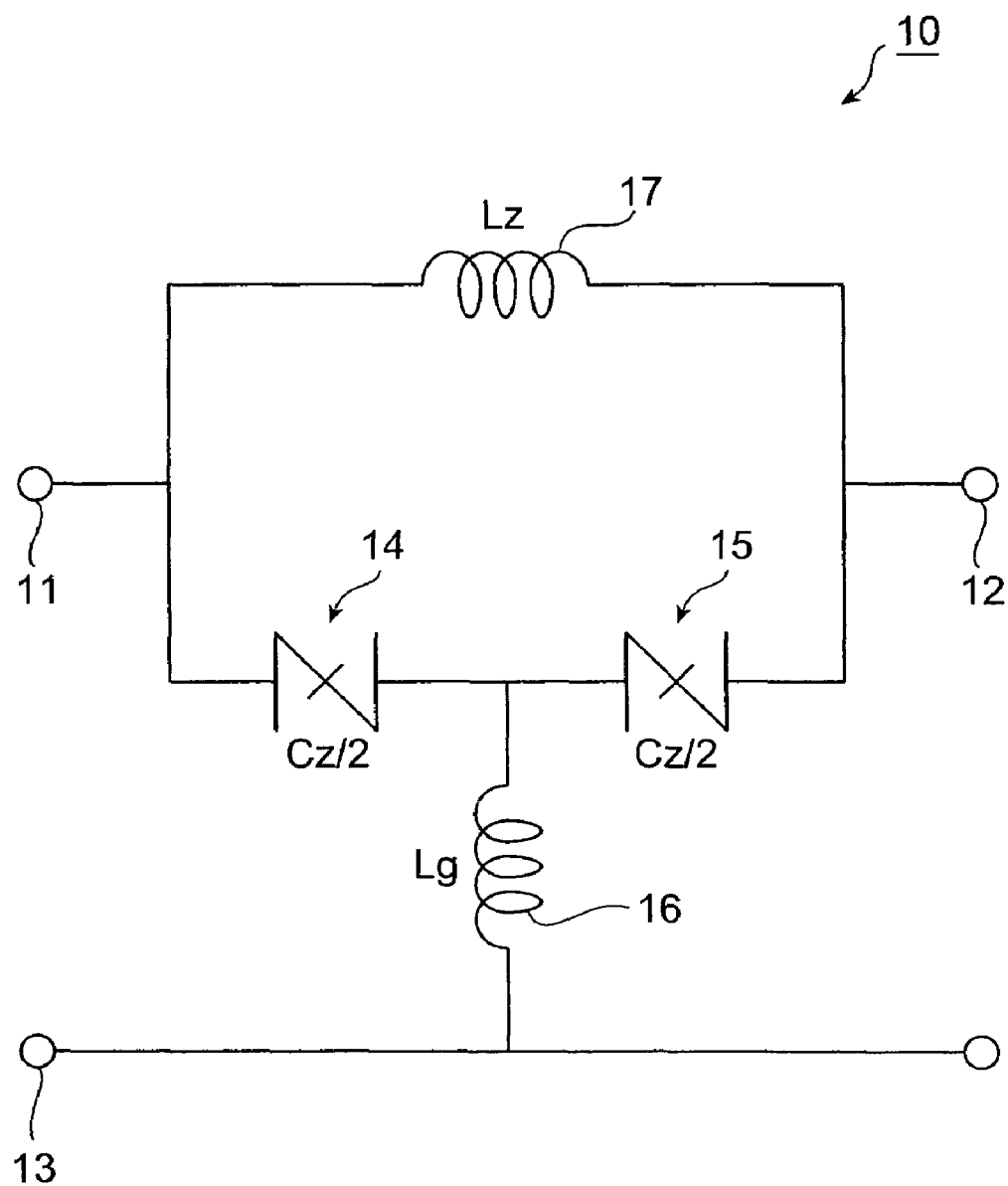
FIG. 7 is a diagram showing a circuit configuration of a surge absorption circuit according to a first embodiment of the present invention.

FIG. 7 is a diagram showing a circuit configuration of a surge absorption circuit according to a first embodiment of the present invention. A surge absorption circuit 10 shown in FIG. 7 comprises an input terminal 11, an output terminal 12, a common terminal 13, a first surge absorption element 14, a second surge absorption element 15, a first inductive element 17, and a second inductive element 16.

The surge absorption circuit 10 has the input terminal 11, the output terminal 12, and the common terminal 13 for connection with an external. The first surge absorption element 14 and the second surge absorption element 15 are connected in series between the input terminal 11 and the output terminal 12. That is, one terminal of the first surge absorption element 14 is connected to the input terminal 11, and one terminal of the second surge absorption element 15 is connected to the output terminal 12. The other terminal of the first surge absorption element 14 and the other terminal of the second surge absorption element 15 are connected to each other.

The first inductive element 17 is connected between the input terminal 11 and the output terminal 12. The first inductive element 17 is provided in parallel to the first surge absorption element 14 and the second surge absorption element 15 which are connected in series.

The second inductive element 16 is connected between a connection point of the first surge absorption element 14 and the second surge absorption element 15 and the common terminal 13. That is, one terminal of the second inductive element 16 is electrically connected to the other terminal of the first surge absorption element 14 and the other terminal of the second surge absorption element 15. The other terminal of the second inductive element 16 is electrically connected to the common terminal 13.

To the first surge absorption element 14 and the second surge absorption element 15, a varistor utilizing a metal oxide such as ZnO, a PN junction element utilizing a semiconductor such as Si, a surge absorption element utilizing molybdenum, a gap type discharge element utilizing discharge between electrodes, and the like can be applied.

Here, the input terminal 11 and the output terminal 12 are distinguished from each other, however, the input side and the output side may be exchanged. Preferably, the common terminal 13 is grounded.

In the following explanation, it is assumed that the stray capacitive component of each of the first surge absorption element 14 and the second surge absorption element 15 is Cz/2, the coefficient of induction (inductance) of the first inductive element 17 is Lz, and the coefficient of the induction of the second inductive element 16 is Lg.

Figure 1:
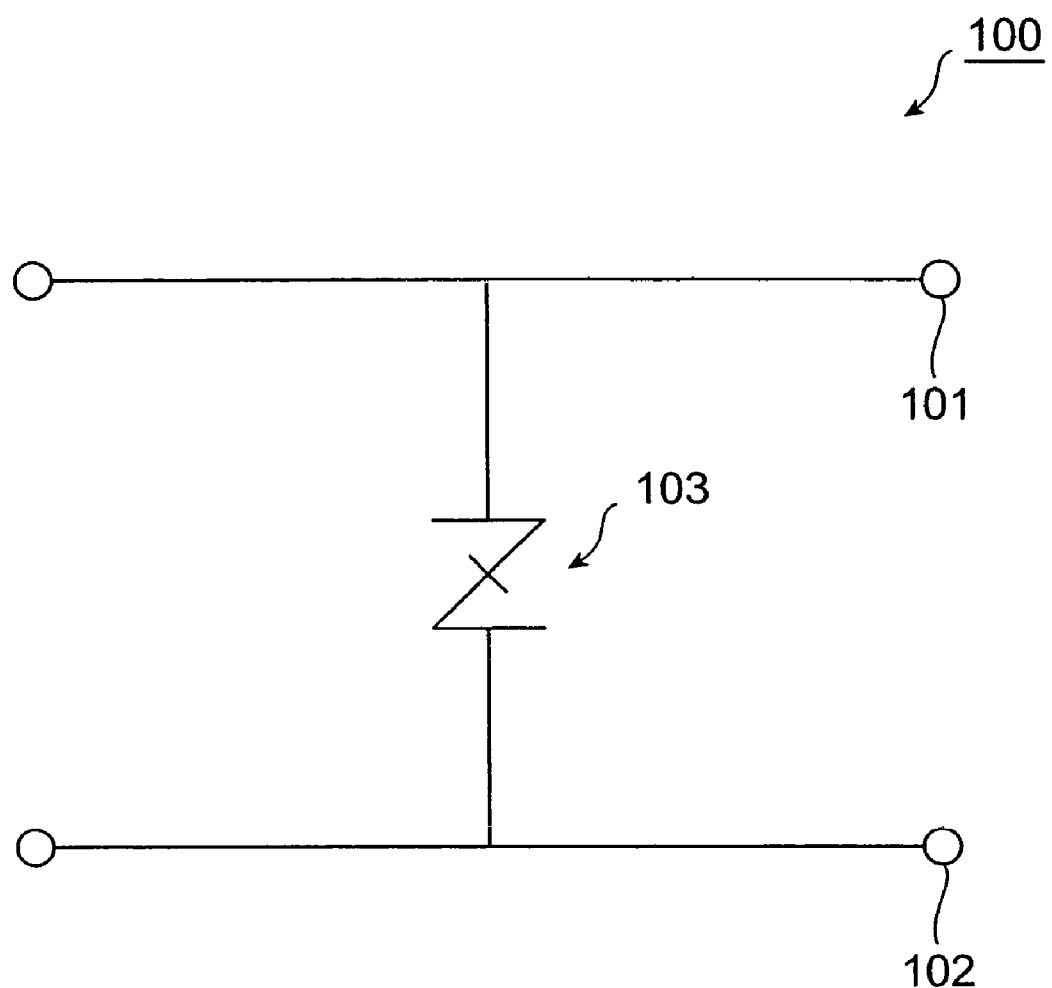
FIG. 1 is a diagram showing a conventional surge absorption circuit to which a varistor has been applied.
Figure 2:
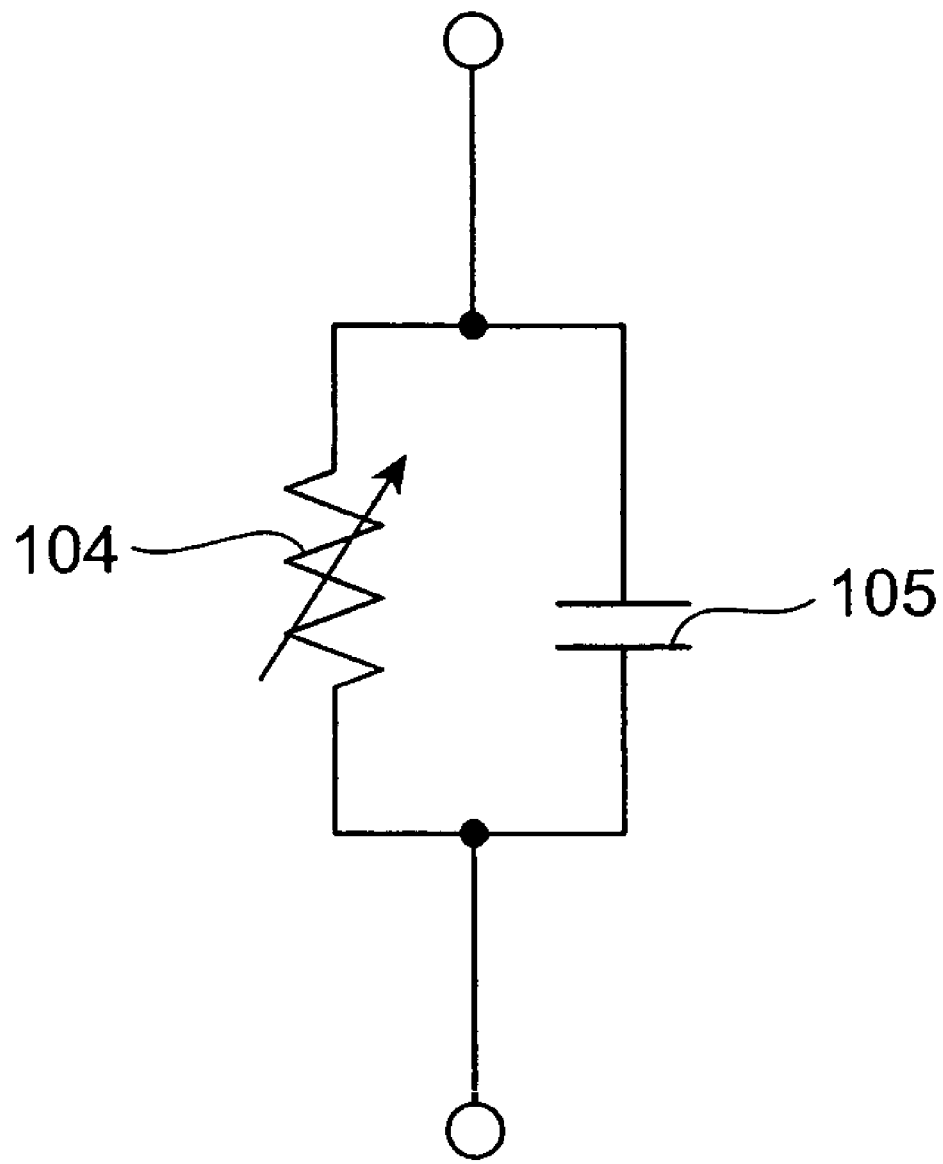
FIG. 2 is a diagram showing an equivalent circuit of a varistor.
Figure 3:
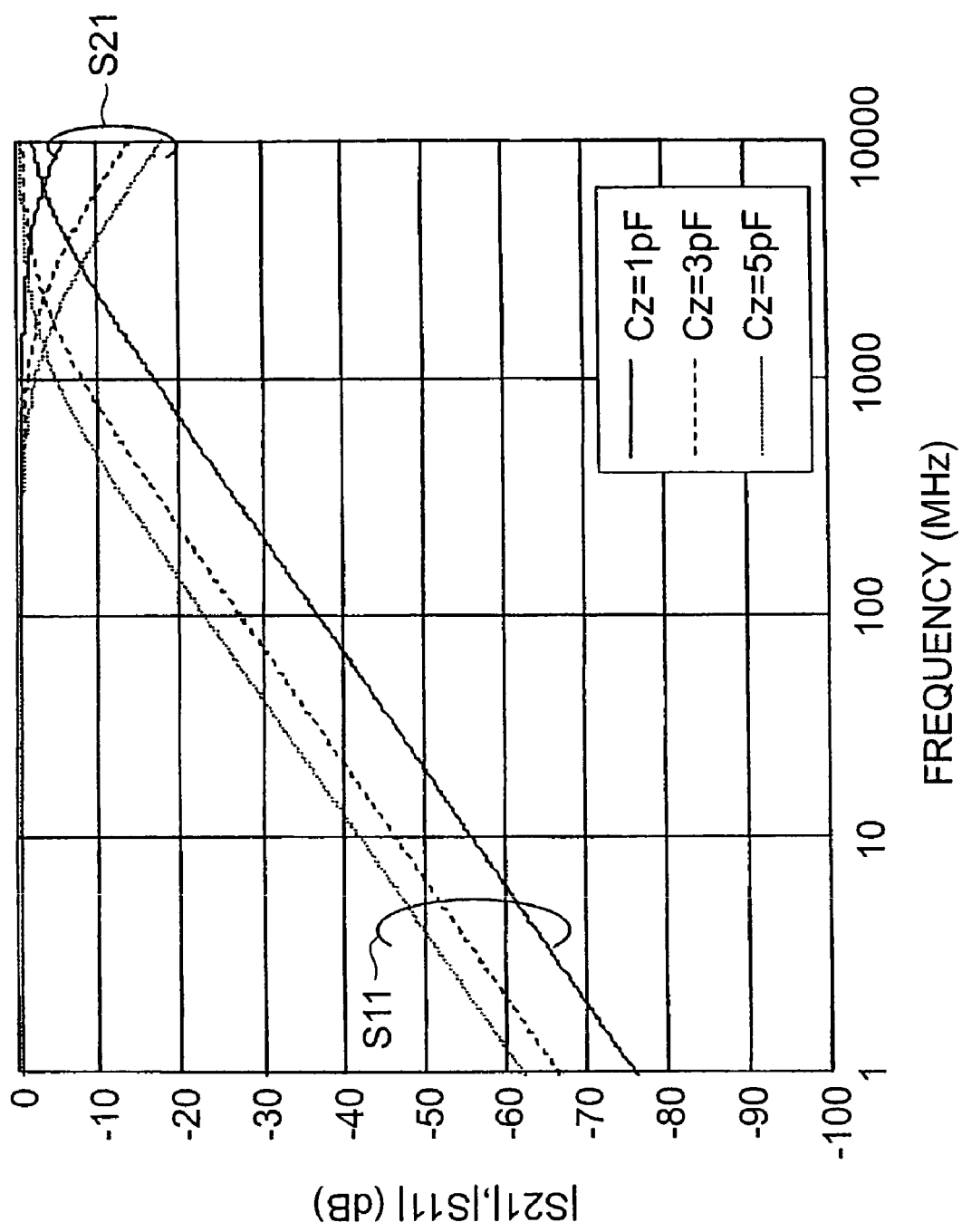
FIG. 3 is a diagram showing the calculation result of S parameters S11 and S21 in a surge absorption circuit expressed by the equivalent circuit in FIG. 2.
Figure 4:
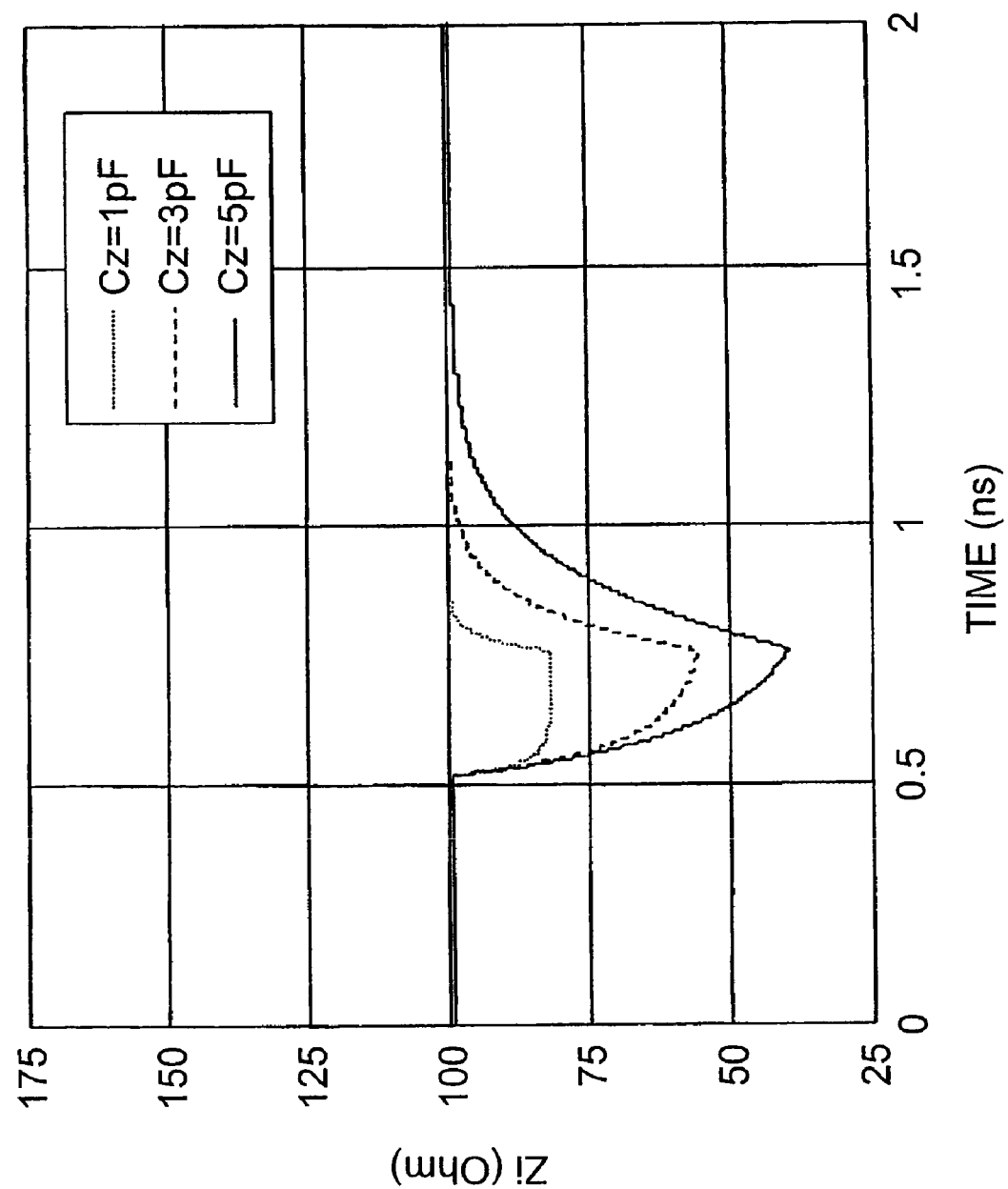
FIG. 4 is a diagram showing the TDR test result of a conventional surge absorption circuit.
Figure 5:
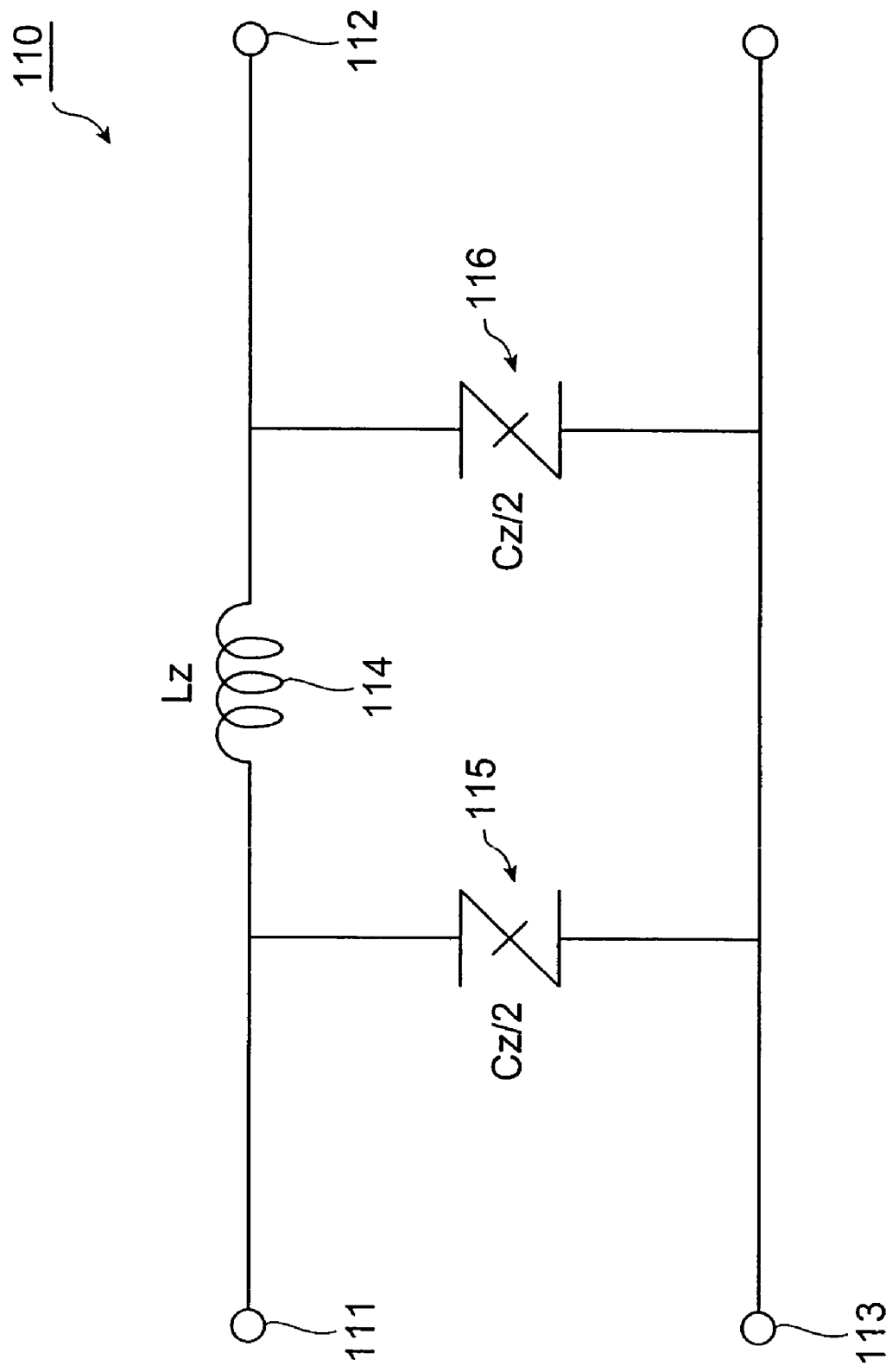
FIG. 5 is a diagram showing an example of a conventional surge absorption circuit in which two varistors are combined with an inductive element.
Figure 6:
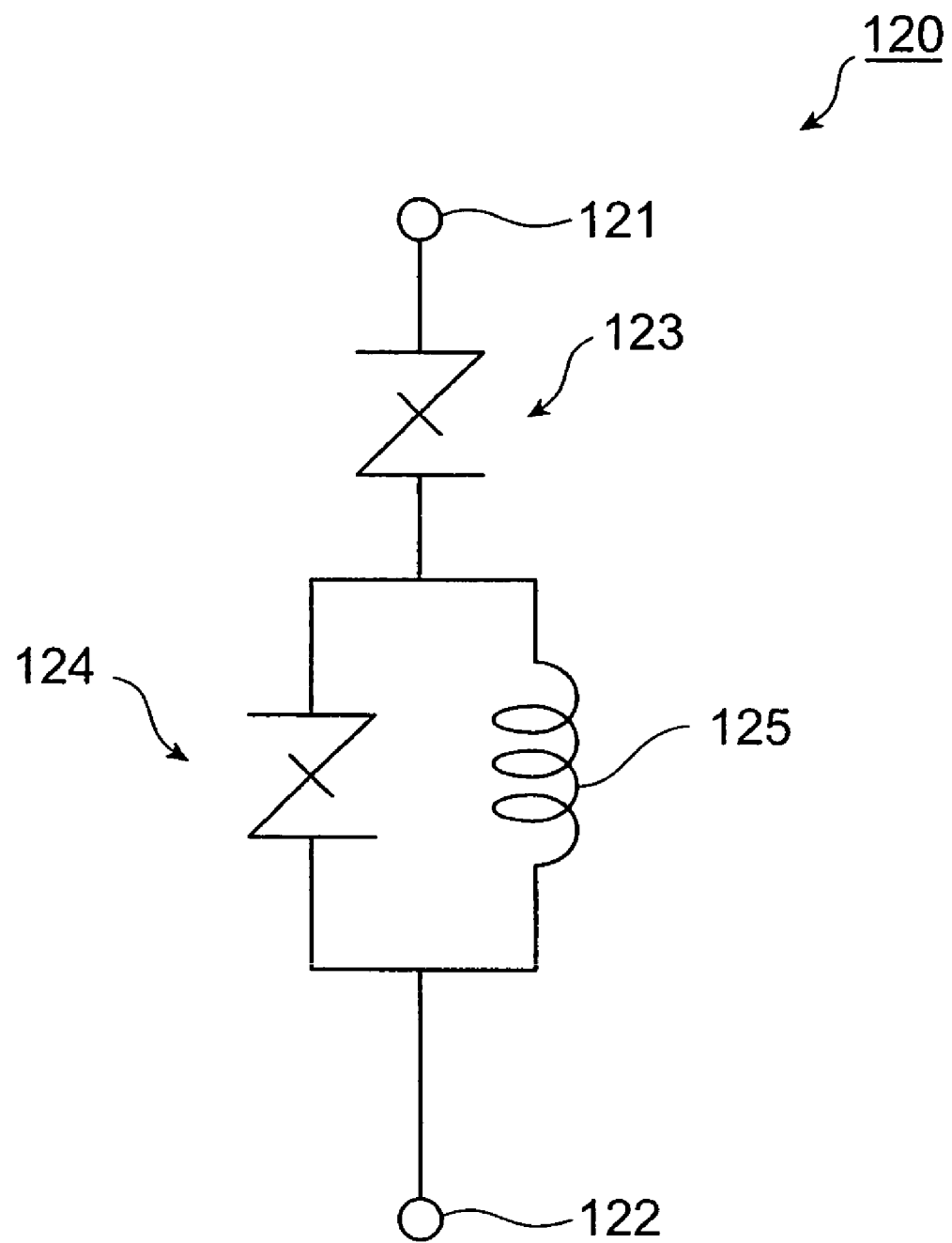
FIG. 6 is a diagram showing an example of a conventional surge absorption circuit in which an inductive element is combined with two varistors.

The input impedance Zin of the surge absorption circuit 10 shown in FIG. 7 is expressed by the following equation (5). Although the first surge absorption element 14 and the second surge absorption element 15 are expressed by the equivalent circuit shown in FIG. 2 respectively, they are approximated only by the stray capacitance 105 of Cz/2 for a high speed signal with a small amplitude respectively.

$$Zin = \sqrt{\frac{Lz}{Cz} \frac{1 - \omega^2 LgCz}{1 - \omega^2 LzCz/4}} \quad (5)$$

When the coefficient of induction of the first inductive element 17 and the coefficient of induction of the second inductive element 16 are set so as to satisfy the equation (6-1) and the equation (6-2) respectively, the input impedance Zin shown in the equation (5) does not depend on frequency, and matches the characteristic impedance Zo.

$$Lz = Z_0^2 Cz \quad (6-1)$$

$$Lg = Lz/4 \quad (6-2)$$

In the surge absorption circuit 10, the coefficient of induction of the first inductive element 17 and the coefficient of induction of the second inductive element 16 can be set so as to satisfy the equation (6-1) and the equation (6-2) respectively. Therefore, the surge absorption circuit 10 is capable of protecting a semiconductor device and the like from high voltage static electricity, and is excellent in impedance matching even for a high speed signal.

Figure 8:
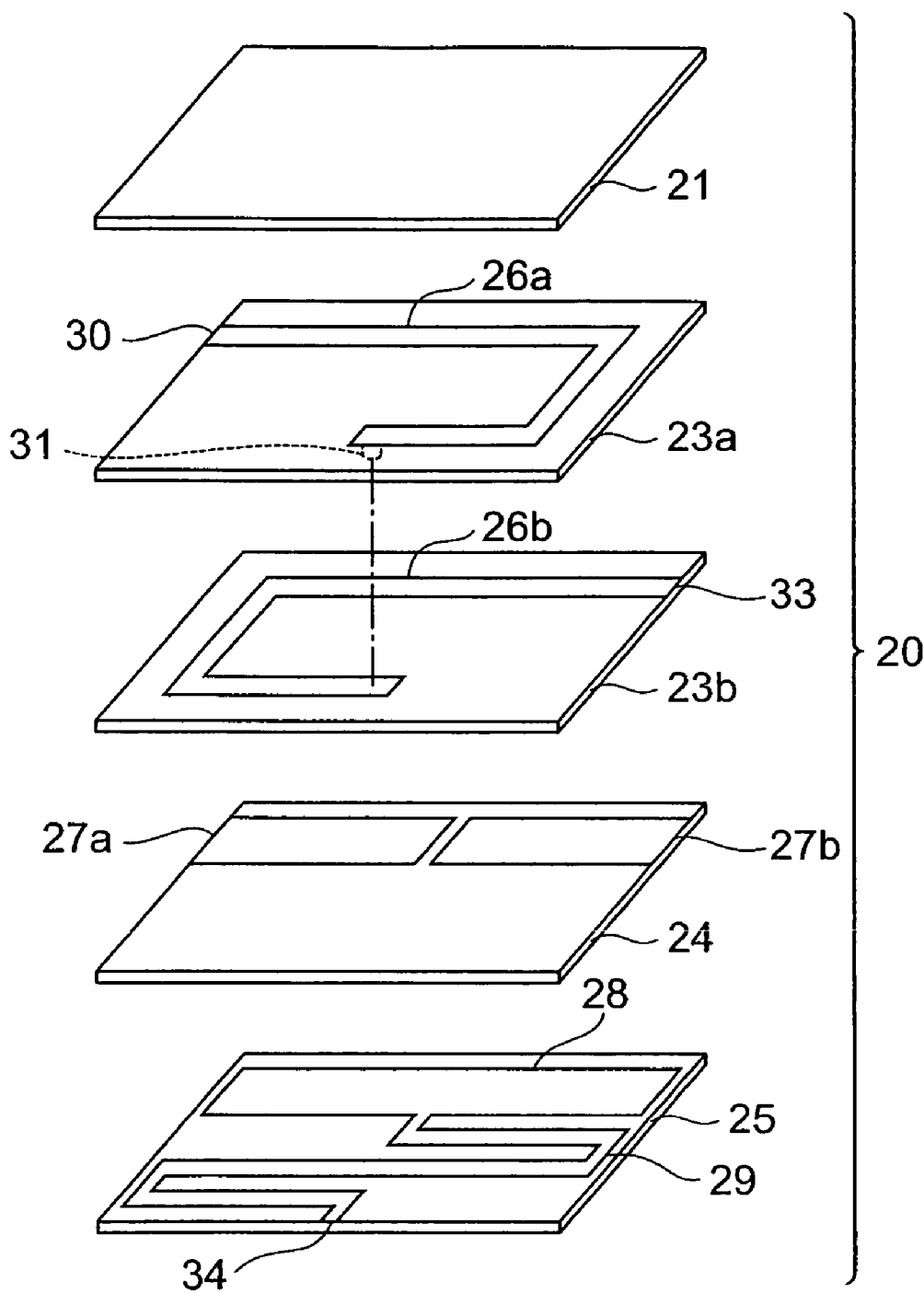
FIG. 8 is an exploded perspective view showing each individual layer of an example of a laminated surge absorption device realized from the surge absorption circuit shown in FIG. 7 as a laminated type device.
Figure 9:
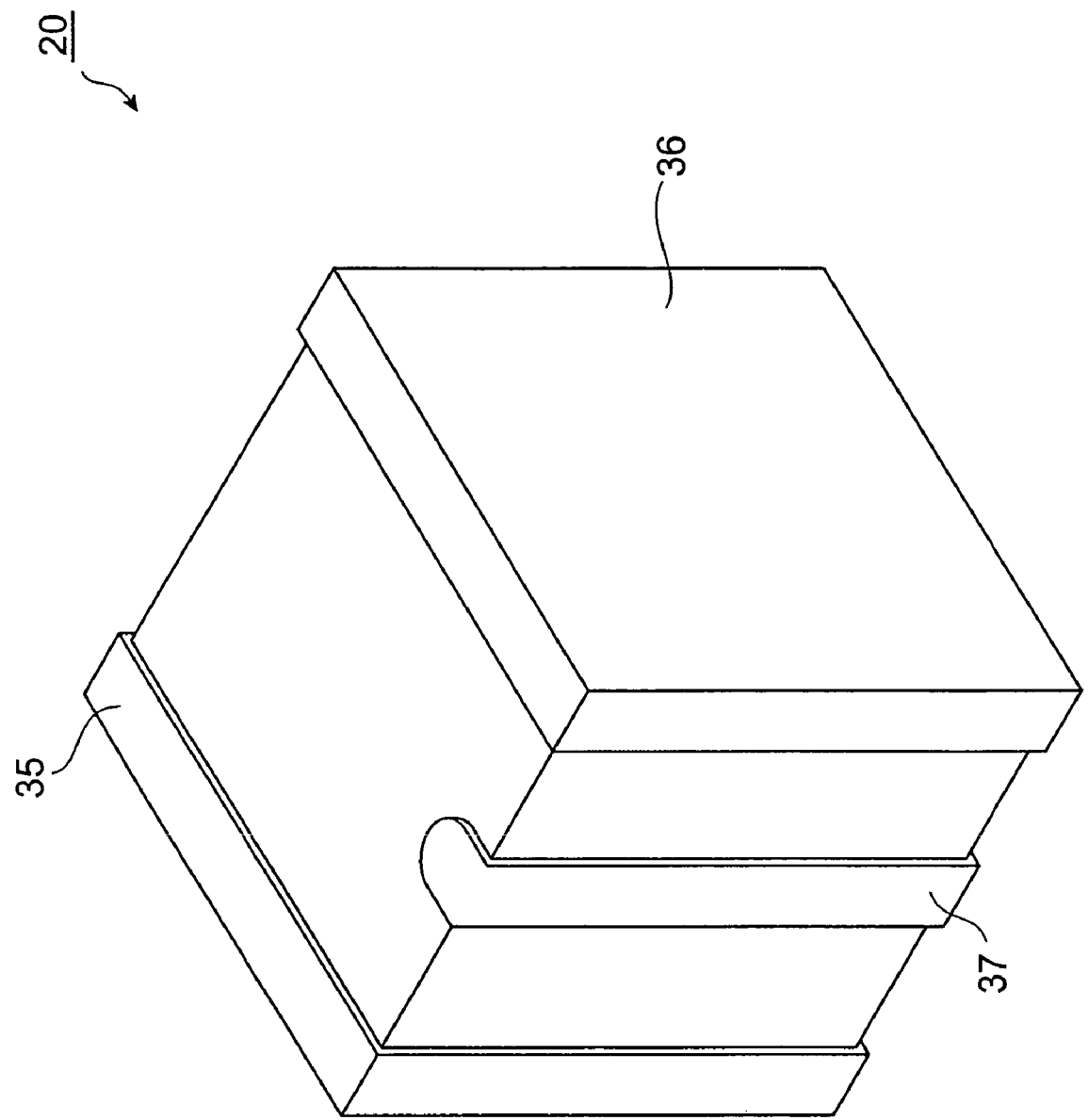
FIG. 9 is a perspective view of an example of a laminated surge absorption device realized from the surge absorption circuit shown in FIG. 7 as a laminated type device.

Next, an example is explained, in which the surge absorption circuit shown in FIG. 7 is realized as a laminated surge absorption device. FIG. 8 is an exploded perspective view showing each individual layer of an example of a laminated surge absorption device realized from the surge absorption circuit shown in FIG. 7 as a laminated type device. FIG. 9 is a perspective view showing an example of a laminated surge absorption device realized from the surge absorption circuit shown in FIG. 7 as a laminated type device.

As shown in FIG. 9, the laminated surge absorption device 20 has an input electrode 35, an output electrode 36, and a common electrode 37 on its surface defined by a plurality of insulating layer. The input electrode 35 can be used as the input terminal 11, the output electrode 36 as the output terminal 12, and the common electrode 37 as the common terminal 13, respectively. Here, the input electrode 35 and the output electrode 36 are distinguished from each other, however, the input side and the output side may be exchanged. Preferably, the common electrode 37 is grounded.

The laminated surge absorption device 20 includes on its surface a pair of planes which extend in the lamination direction of the plurality of layers constituting the laminated surge absorption device and faces with each other. The input electrode 35 is provided on one of the pair of planes and the output electrode 36 is provided on the other of the pair of planes.

The laminated surge absorption device 20 includes on its surface another pair of planes extending in the lamination direction described above and facing with each other. The common electrode 37 is provided on one of the other pair of planes. The common electrode 37 extends in the lamination direction described above.

Hereinafter, the structure and the material of each insulating layer constituting the laminated surge absorption device 20 are explained. As shown in FIG. 8, the laminated surge absorption device 20 has flat-plane-shaped insulating layers 21, 23a, 24b, 24, and 25 laminated in order in the lamination direction described above, inductive element patterns 26a and 26b, surge absorption element patterns 27a and 27b, surge absorption element pattern 28, inductive element pattern 27, and via hole 31.

For the insulating layers 21, 23a, 23b, 24, and 25, a material with improved insulating properties for the circuit on the surface, for example, a dielectric material such as glass epoxy resin, fluorine contained resin, and ceramic and the like can be used. Each element pattern formed on the surface of the insulating layer may be composed of a conductive material such as gold, platinum, silver, copper, lead, and alloy of these metals and the like, and can be manufactured by printing technology or etching technology.

The insulating layer 21 prevents the internal element pattern from coming into contact with the external. On the surface (one main surface) of the insulating layer 23a, the inductive element pattern 26a forming one part of the first inductive element 17, that is one part of a first inductive element pattern, is formed. As one terminal of the first inductive element 17, one end 30 of the inductive element pattern 26a is connected to the input electrode 35. The other end of the inductive element pattern 26a is connected to the other end of the inductive element pattern 26b via the via hole 31 formed in the insulating layer 23a.

On a surface (one main surface) of the insulating layer 23b, inductive element pattern 26b forming the other part of the first inductive element 17, that is the other part of the first inductive element pattern, is formed. As the other terminal of the first inductive element 17, one end 33 of the inductive element pattern 26b is connected to the output electrode 36.

In this example, the first inductive element pattern is separated and is formed on the two layers. However, the first inductive element pattern may be formed on one layer. If formed in plural layers, it is possible to realize a large coefficient of induction. In addition, although the inductive element patterns are formed in a helical pattern, they may be formed in a spiral pattern or a meander pattern.

On the surface (one main surface) of the insulating layer 24, the surge absorption element pattern 27a (i.e. one of a pair of first surge absorption element patterns) and the surge absorption element pattern 27b (i.e. one of a pair of second surge absorption element patterns) are formed. One end of the surge absorption element pattern 27a is connected to the input electrode 35, and one end of the surge absorption element pattern 27b is connected to the output electrode 36.

On the surface (one main surface) of the insulating layer 25, the surge absorption element pattern 28 is formed. One part of the surge absorption element pattern 28 (i.e. the other of the pair of first surge absorption element patterns) and the surge absorption element pattern 27a face with each other, placing the insulating layer 24 therebetween, thereby forming the first surge absorption element 14. The other part of the surge absorption element pattern 28 (i.e. the other of the pair of second surge absorption element patterns) and the surge absorption element pattern 27b face with each other, placing the insulating layer 24, thereby forming the second surge absorption element 15.

A via hole is provided in the insulating layer 24 and the via hole is filled with a material showing the varistor characteristics, for example, a semiconductor ceramic material containing ZnO as its main component. Alternatively, a material showing the varistor characteristics, for example, a semiconductor ceramic material containing ZnO as its main component may be used to form the insulating layer 24. In the example shown in FIG. 8, one surface of the surge absorption element patterns facing with each other is formed in a single layer, however, it may be formed in plural layers.

Further, on the insulating layer 25, the inductive element pattern 29 (i.e. the second inductive element pattern) is formed. The inductive element pattern 29 configures the second inductive element 16. As one terminal of the second inductive element 16, one end of the inductive element pattern 29 is connected to the surge absorption element pattern 28. As the other terminal of the second inductive element 16, the other end 34 of the inductive element pattern 29 is connected to the common electrode 37.

A laminated body as shown in FIG. 9 can be manufactured by integrated baking after the plural layers shown in FIG. 8 are laminated in order and adhered under pressure to each other. On the surface of the laminated body, the input electrode 35, the output electrode 36, and the common electrode 37 are formed. As an electrode material, a conductive material such as gold, platinum, silver, copper, lead, and alloy of these metals and the like can be applied.

In the laminated surge absorption device 20 completed in the manner described above, the inductive elements and the surge absorption elements are formed in integrated manner. Therefore, the laminated surge absorption device 20 can be compact and reduce the stray capacitance. Further, due to the circuit configuration of the surge absorption circuit 10 described above, the laminated surge absorption device 20 is capable of protecting a semiconductor device or the like from high voltage static electricity, and is excellent in impedance matching even for a high speed signal.

Figure 10:
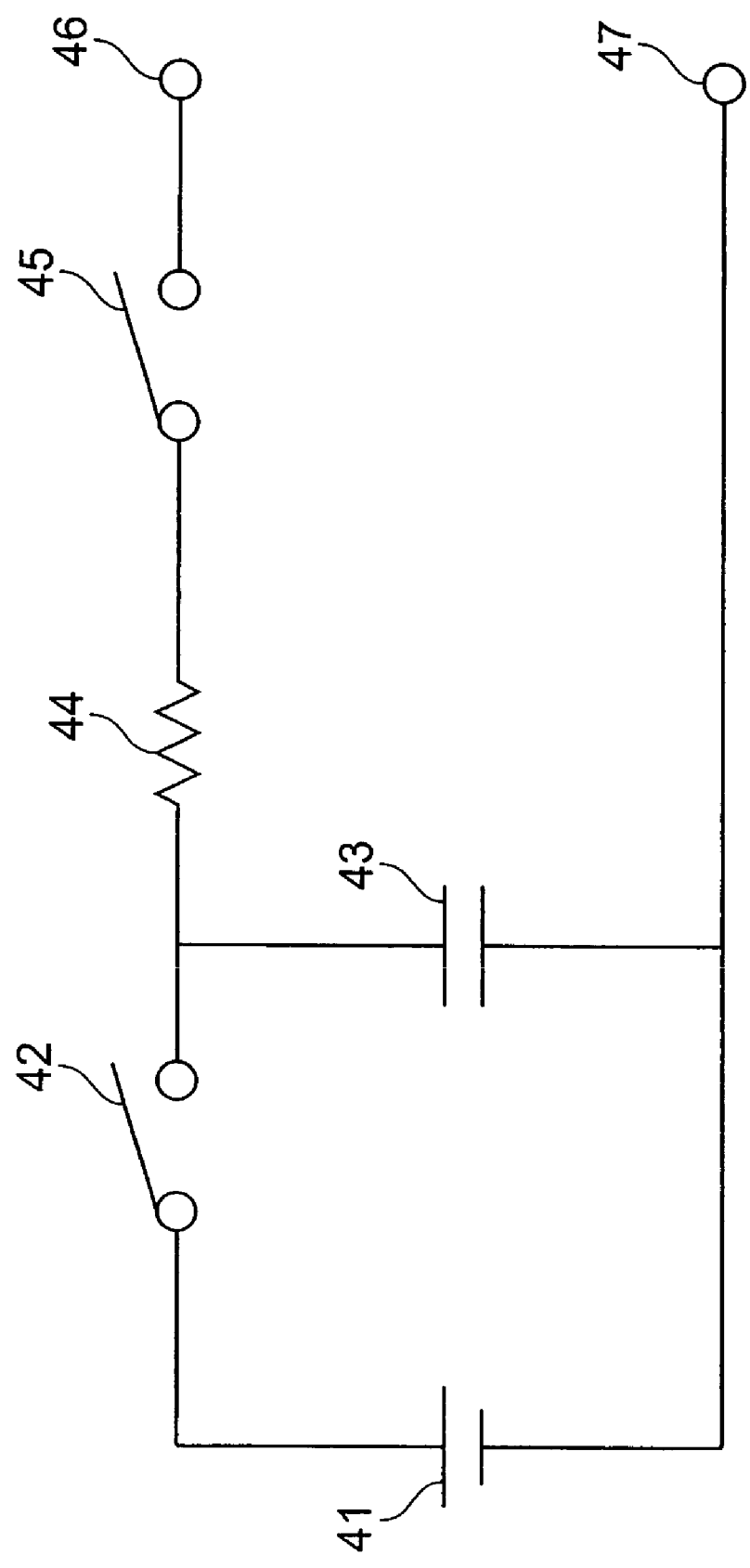
FIG. 10 is a diagram showing a circuit of a surge test apparatus.

Hereinafter, the surge test conducted to the laminated surge absorption device 20 described above is explained. FIG. 10 is a diagram showing a circuit of a surge test apparatus. The surge test apparatus shown in FIG. 10 is designed so as to have a direct current voltage source 41, a switch 42, a capacitive element 43, a resistor 44, a switch 45, and output terminals 46 and 47.

Between the output terminal 46 and the output terminal 47 of the surge test apparatus, a load circuit is connected, in which the laminated surge absorption device 20 and a load resistor (for example, 50 Ω) is connected in parallel. Specifically, the input electrode 35 of the laminated surge absorption device 20 is connected to the output terminal 46, and the common electrode 37 of the laminated surge absorption device 20 is connected to the output terminal 47. Further, one terminal of the load resistor is connected to the output electrode 36 of the laminated surge absorption device 20, and the other terminal of the load resistor is connected to the common electrode 37 of the laminated surge absorption device 20. Furthermore, the capacitance of the capacitive element 43 is set to 150 pF and the resistance of the resistor 44 is set to 330 Ω. Then, a voltage of 2 kV from the direct current voltage source 41 is supplied.

First, in a state in which the switch 45 was left in an open state, the switch 42 was closed and the capacitive element 43 was charged from the direct current voltage source 41. Next, the switch 42 was opened and the switch 45 was closed, then the electric charges charged in the capacitive element 43 were applied to the load circuit composed of the laminated surge absorption device 20 and the load resistor via the resistor 44. At this time, the voltage applied to the load circuit was measured.

Figure 11:
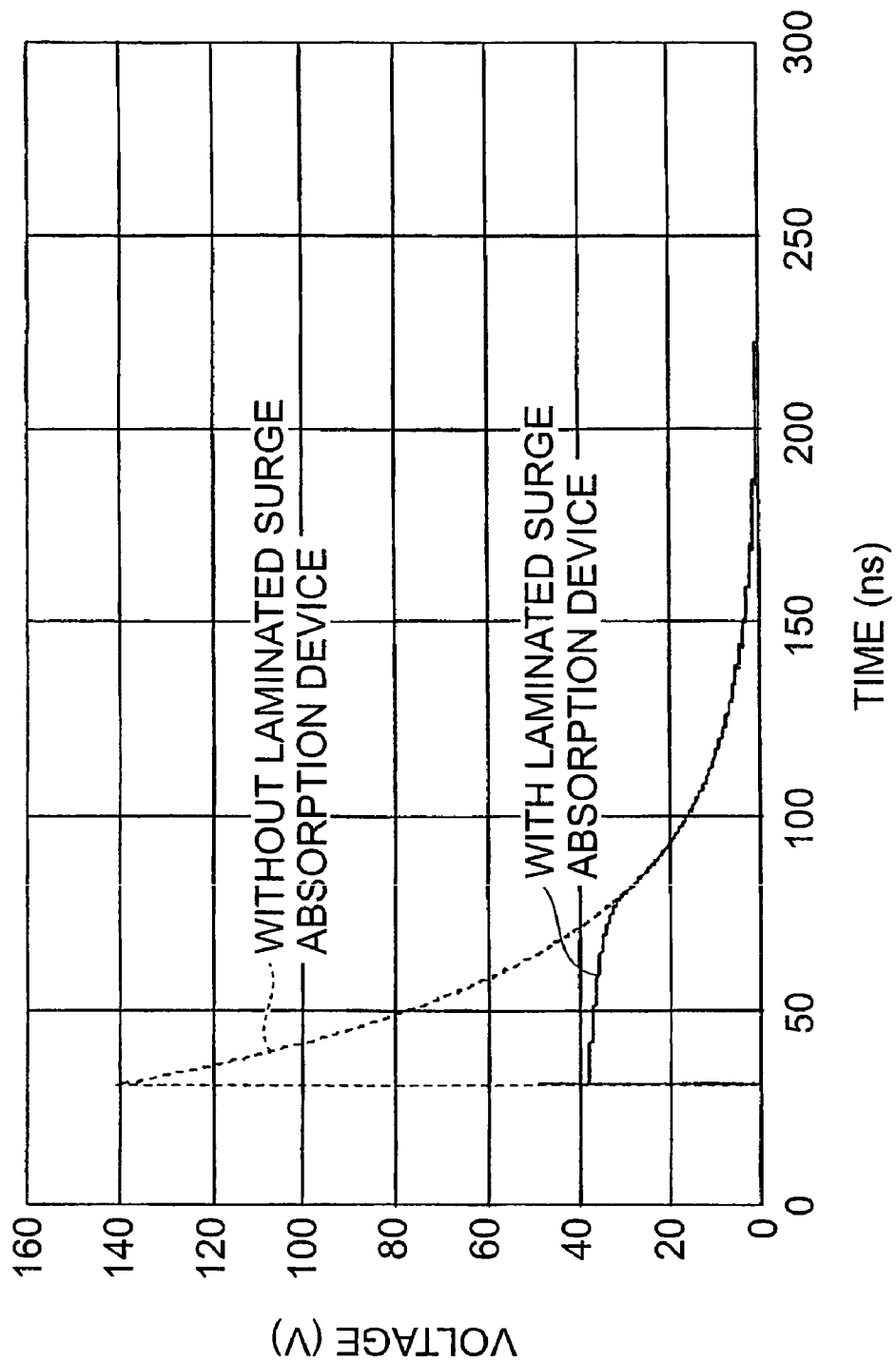
FIG. 11 is a diagram showing the result of the measurement of the voltage applied to a load circuit composed of the laminated surge absorption device shown in FIG. 9 and a load resistor.

The measurement result is shown in FIG. 11. In FIG. 11, the horizontal axis represents time (ns) and the vertical axis represents a discharge voltage (V), and the discharge voltage is compared with and without the laminated surge absorption device 20. From FIG. 11, it can be seen that a surge is sufficiently absorbed by adding the laminated surge absorption device 20 of the present embodiment. Therefore, the laminated surge absorption device 20 having the configuration of the surge absorption circuit 10 of the present embodiment has high performance surge absorption characteristics and is compact and excellent in impedance matching even for a high speed signal.

Second Embodiment

Figure 12:
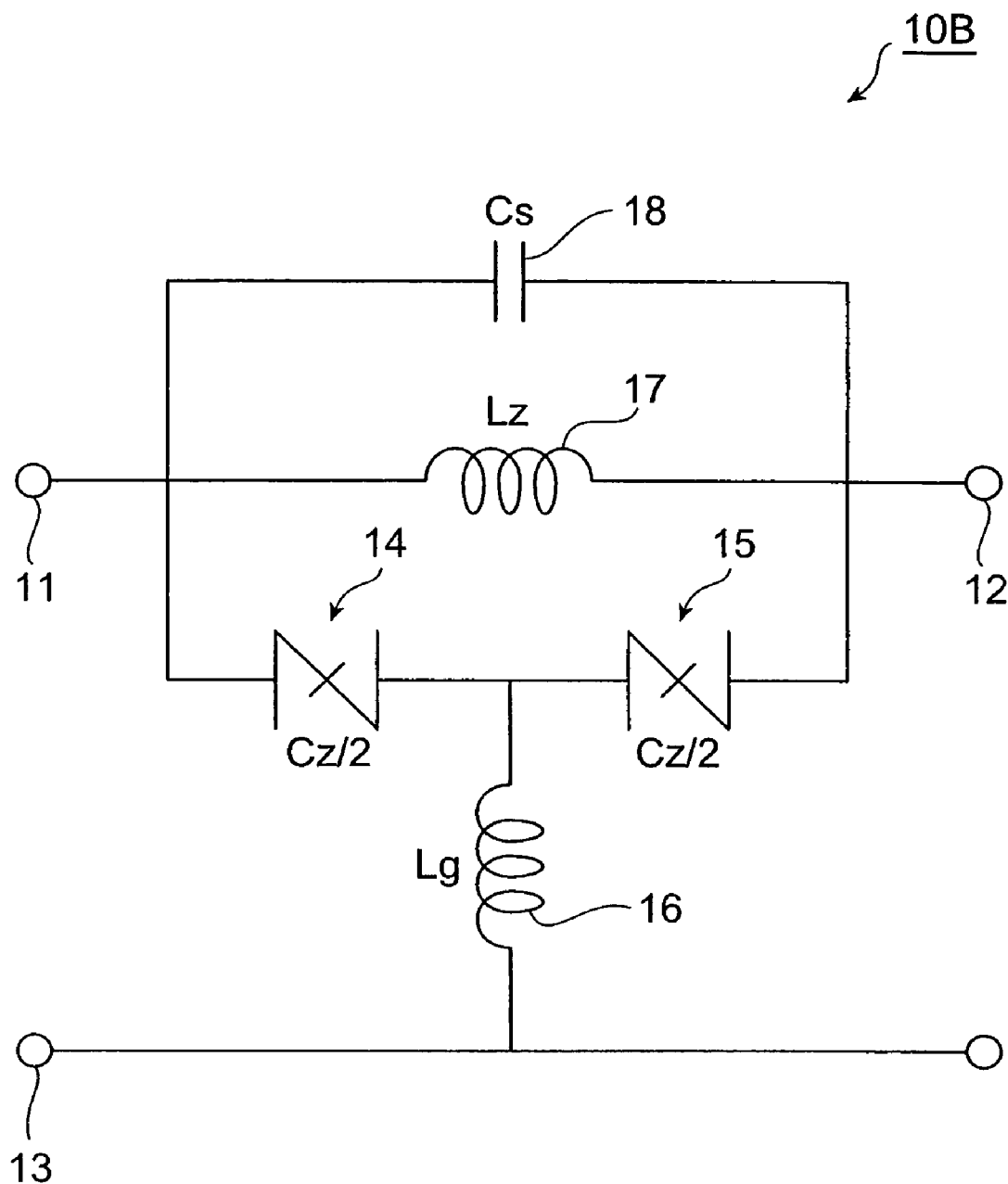
FIG. 12 is a diagram showing a circuit configuration of a surge absorption circuit according to a second embodiment of the present invention.

FIG. 12 is a diagram showing a circuit configuration of a surge absorption circuit according to a second embodiment of the present invention. A surge absorption circuit 10B shown in FIG. 12 comprises the input terminal 11, the output terminal 12, the common terminal 13, the first surge absorption element 14, the second surge absorption element 15, the first inductive element 17, the second inductive element 16, and a capacitive element 18.

The surge absorption circuit 10B has a configuration in which the capacitive element 18 is added in addition to the constituent elements of the surge absorption circuit 10 of the first embodiment. The capacitive element 18 is connected to the input terminal 11 and the output terminal 12, and provided in parallel to the series part composed of the first surge absorption element 14 and the second surge absorption element 15.

Here, the input terminal 11 and the output terminal 12 are distinguished from each other, however, the input side and the output side may be exchanged. Preferably, the common terminal 13 is grounded.

In the following explanation, it is assumed that the stray capacitive component of each of the first surge absorption element 14 and the second surge absorption element 15 is Cz/2, the coefficient of induction (inductance) of the first inductive element 17 is Lz, the coefficient of the induction of the second inductive element 16 is Lg, and the capacitance of the capacitive element 18 is Cs.

The input impedance of the surge absorption circuit 10B shown in FIG. 12 is expressed by the following equation (7). Although the surge absorption elements 14 and 15 are expressed by the equivalent circuit shown in FIG. 2 respectively, each of them is approximated only by the stray capacitance 105 of Cz/2 for a high speed signal with a small amplitude.

$$Zin = \sqrt{\frac{Lz}{Cz} \frac{1 - \omega^2 LgCz}{1 - \omega^2 Lz(Cs + Cz/4)}} \tag{7}$$

When the coefficient of induction of the first inductive element 17 and the coefficient of induction of the second inductive element 16 are set so as to satisfy the equation (8-1) and the equation (8-2) respectively, the input impedance Zin in the equation (7) does not depend on frequency, and matches the characteristic impedance Zo.

$$Lz = Z_0^2 Cz \tag{8-1}$$

$$Lg = Lz/4 + Z_0^2 Cs \tag{8-2}$$

As understood from the above-mentioned equations (8-1) and (8-2), in the surge absorption circuit 10B, the capacitance of the capacitive element can be selected arbitrarily with respect to the stray capacitances of the surge absorption elements. Therefore, the surge absorption circuit 10B can be designed more flexibly than the surge absorption circuit 10 of the first embodiment.

Further the surge absorption circuit 10B in the present embodiment is capable of protecting a semiconductor device and the like from high voltage static electricity and is excellent in impedance matching even for a high speed signal.

Figure 13:
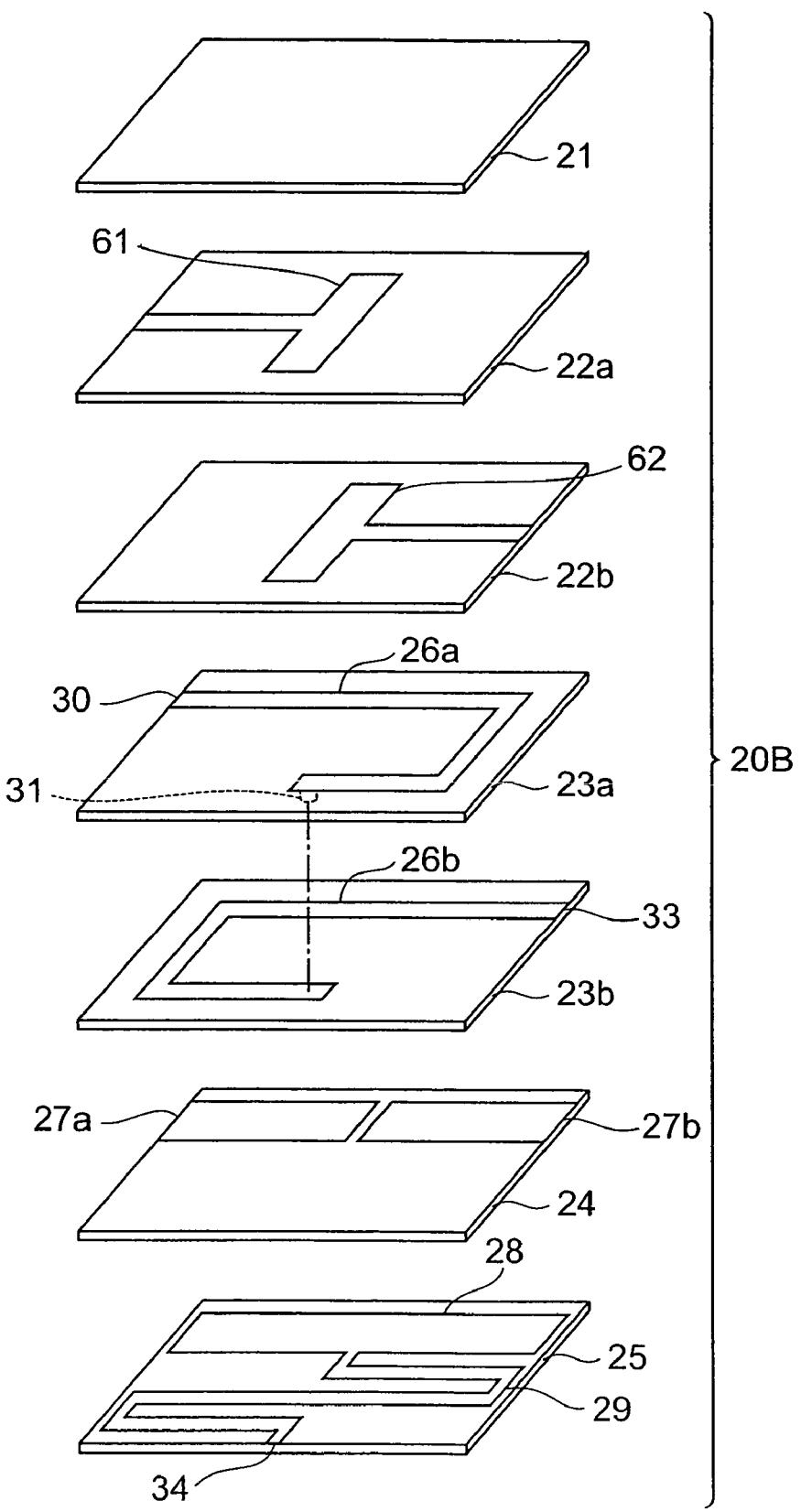
FIG. 13 is an exploded perspective view showing each individual layer of a laminated surge absorption device realized from the surge absorption circuit shown in FIG. 12 as a laminated type device.

Next, an example is described, in which the surge absorption circuit 10B is realized as a laminated surge absorption device. FIG. 13 is an exploded perspective view showing each individual layer of a laminated surge absorption device realized from the surge absorption circuit shown in FIG. 12 as a laminated type device.

A laminated surge absorption device 20B shown in FIG. 13 has insulating layers 22a and 22b, and inductive element patterns 61 and 62 in addition to the constituent elements of the surge absorption device 20 of the first embodiment.

The structure and material of each insulating layer constituting the laminated surge absorption device show in FIG. 13 are the same as those of the laminated surge absorption device 20.

In the laminated surge absorption device 20B, the insulating layers 22a and 22b are provided between the insulating layers 21 and 23a. On one main surface of the insulating layer 22a, the capacitive element pattern 61 (i.e. one of a pair of capacitive element patterns) is provided. On one main surface of the insulating layer 22b, the capacitive element pattern 62 (i.e. the other of a pair of capacitive element patterns) is provided.

A part of the capacitive element pattern 61 and a part of the capacitive element pattern 62 faces with each other, placing the insulating layer 22a therebetween, thereby forming the capacitive element 18.

In the laminated surge absorption device 20B, the inductive element patterns 26a and 26b, and the capacitive element patterns 61 and 62 are formed on the different insulating layers respectively. However they may be formed on the same insulating layer. Further, the line widths of the inductive element patterns 26a and 26b may be increased and used as a capacitive element patterns.

The laminated surge absorption device 20B has the same external shape as that of the laminated surge absorption device 20. The laminated surge absorption device 20B has the input electrode 35, the output electrode 36, and the common electrode 37 on its surface, similar to the laminated surge absorption device 20.

As one terminal of the capacitive element 18, one end of the capacitive element pattern 61 is connected to the input electrode 35. As the other terminal of the capacitive element 18, one end of the capacitive element pattern 62 is connected to the output electrode 36.

One end 30 of the inductive element pattern 26a is connected to the input electrode 35, and one end 33 of the inductive element pattern 26b is connected to the output electrode 36. To the common electrode 37, one end 34 of the inductive element pattern 29 is connected. Here, the input electrode 35 and the output electrode 36 are distinguished from each other, however, the input side and the output side may be exchanged. Preferably, the common electrode 37 is grounded.

In the laminated surge absorption device 20B completed in the manner described above, the inductive elements and the surge absorption elements are formed in integrated manner. Therefore, the laminated surge absorption device 20B can be compact and reduce the stray capacitance. Further, due to the circuit configuration of the surge absorption circuit 10B described above, the laminated surge absorption device 20B is capable of protecting a semiconductor device or the like from high voltage static electricity, and is excellent in impedance matching even for a high speed signal. The surge test result of the laminated surge absorption device 20B was as excellent as the laminated surge absorption device 20 in the first embodiment.

Figure 14:
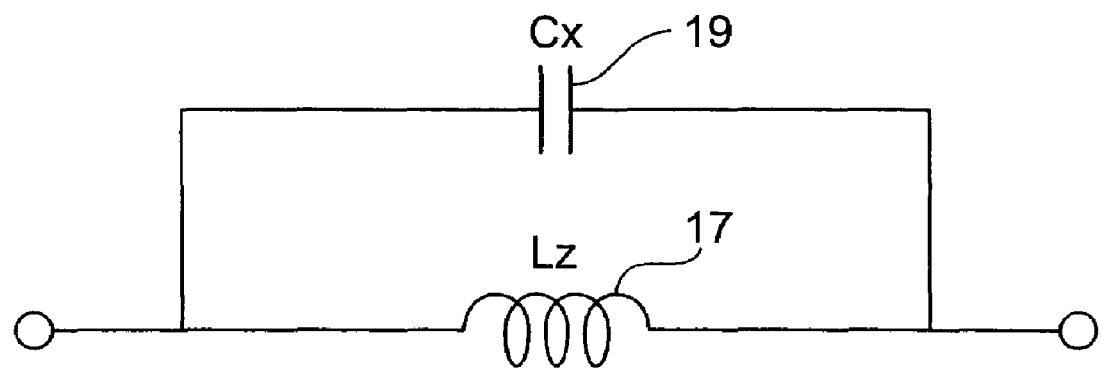
FIG. 14 is a diagram showing an equivalent circuit of the first inductive element.

Incidentally, the inductive element 17 may have a stray capacitive component in some case. The equivalent circuit in case that the inductive element 17 has the stray capacitive component is shown in FIG. 14. In the equivalent circuit shown in FIG. 14, the inductive element 17 and the capacitive element 19, which is the stray capacitive component included in the inductive element 17, are provided in parallel between one terminal and the other terminal. In the following explanation, a capacitance of the stray capacitive component 19 is Cx.

When the inductive element 17 has the stray capacitive component shown in FIG. 14, an input impedance of the surge absorption circuit 10B shown in FIG. 12 is expressed by the following equation (9). Although the surge absorption elements 14 and 15 are expressed by the equivalent circuit shown in FIG. 2 respectively, each of them is approximated only by the stray capacitance 105 of Cz/2 for a high speed signal with a small amplitude.

$$Zin = \sqrt{\frac{Lz}{Cz} \frac{1 - \omega^2 LgCz}{1 - \omega^2 Lz(Cs + Cx + Cz/4)}} \quad (9)$$

When Lz and Lg are set so as to satisfy the following equations (10-1) and (10-2) respectively, the input impedance Zin shown in the equation (9) does not depend on frequency, and matches the characteristic impedance Zo.

$$Lz = Z_0^2 Cz \quad (10\text{-}1)$$

$$Lg = Lz/4 + Z_0^2(Cs + Cx) \quad (10\text{-}2)$$

As understood from the above-mentioned equations (10-1) and (10-2), when the first inductive element 17 has a stray capacitive component, it is possible to cancel the influence of the stray capacitive components of the surge absorption elements 14 and 15, and the stray capacitive component of the first inductive element 17.

If the inductive element 17 has the stray capacitive component in the configuration in which the capacitive element 18 is not added, that is the configuration of the surge absorption circuit 10, when Lz and Lg are set according to the result obtained by applying Cs=0 to the equations (9), (10-1), and (10-2), it is possible to cancel the influence of the stray capacitive components of the surge absorption elements 14 and 15, and the stray capacitive component of the first inductive element 17.

Therefore the surge absorption circuit of the present embodiment is capable of protecting a semiconductor device and the like from high voltage static electricity and is excellent in impedance matching even for a high speed signal.

As described above about the preferred embodiments of the present invention, according to the present invention, a surge absorption circuit that protects a semiconductor device and the like from high voltage static electricity and is excellent in impedance matching over a wide frequency band is provided. The surge absorption circuit and the laminated surge absorption device according to the present invention can be applied to a high frequency circuit substrate mounting a semiconductor.

What is claimed is:

1. A surge absorption circuit comprising:
   an input terminal;
   an output terminal;

a common terminal;

a first surge absorption element and a second surge absorption element which are connected in series between the input terminal and the output terminal;

a first inductive element provided in parallel to the first surge absorption element and the second surge absorption element, and connected to the input terminal and the output terminal;

a second inductive element connected to a connection point of the first surge absorption element and the second surge absorption element and connected to the common terminal.

2. The surge absorption circuit according to claim 1, further comprising a capacitive element provided in parallel to the first surge absorption element and the second surge absorption element, and connected to the input terminal and the output terminal.

3. A laminated surge absorption device configuring the surge absorption circuit defined in claim 1, the laminated surge absorption device being configured as a laminated body which includes conductive patterns in interior portion and on a surface thereof.

4. A laminated surge absorption device configuring the surge absorption circuit defined in claim 2, the laminated surge absorption device being configured as a laminated body which includes conductive patterns in interior portion and on a surface thereof.

5. A laminated surge absorption device configuring the surge absorption circuit defined in claim 1, comprising:

a plurality of insulating layers laminated each other;

a pair of first surge absorption element patterns including a conductor and facing with each other via any one of the insulating layers;

a pair of second surge absorption element patterns including a conductor and facing with each other via any one of the insulating layers;

a first inductive element pattern including a conductor and provided on any one of the insulating layers;

a second inductive element pattern including a conductor and provided on any one of the insulating layers;

an input electrode provided on a surface define by the insulating layers;

an output electrode provided on the surface; and a common electrode provided on the surface;

wherein one of the pair of the first surge absorption element patterns is connected to the input electrode, one of the pair of the second surge absorption element patterns is connected to the output electrode, the other of the pair of the first surge absorption element patterns and the other of the pair of the second surge absorption element patterns are connected to each other, one end of the first inductive element pattern is connected to the input electrode, the other end of the first inductive element pattern is connected to the output electrode, one end of the second inductive element pattern is connected to the other of the pair of first surge absorption element patterns and the other of the pair of the second surge absorption element patterns, and the other end of the second inductive element pattern is connected to the common electrode.

6. A laminated surge absorption device configuring the surge absorption circuit defined in claim 2, comprising:

a plurality of insulating layers laminated each other;

a pair of first surge absorption element patterns including a conductor and facing with each other via any one of the insulating layers;

a pair of second surge absorption element patterns including a conductor and facing with each other via any one of the insulating layers;

a first inductive element pattern including a conductor and provided on any one of the insulating layers;

a second inductive element pattern including a conductor and provided on any one of the insulating layers;

a pair of capacitive element patterns including a conductor and facing with each other via any one of the insulating layers;

an input electrode provided on a surface define by the insulating layers;

an output electrode provided on the surface; and a common electrode provided on the surface;

wherein one of the pair of the first surge absorption element patterns is connected to the input electrode, one of the pair of the second surge absorption element patterns is connected to the output electrode, the other of the pair of the first surge absorption element patterns and the other of the pair of the second surge absorption element patterns are connected to each other, one end of the first inductive element pattern is connected to the input electrode, the other end of the first inductive element pattern is connected to the output electrode, one of the pair of capacitive element patterns is connected to the input electrode, the other of the pair of capacitive element patterns is connected to the output electrode, one end of the second inductive element pattern is connected to the other of the pair of first surge absorption element patterns and the other of the pair of the second surge absorption element patterns, and the other end of the second inductive element pattern is connected to the common electrode.

* * * * *